United States Patent [19]
Branson et al.

[11] Patent Number: 5,457,849
[45] Date of Patent: Oct. 17, 1995

[54] COMPACT DETACHABLE DOLLY FOR HEAVY COMPUTER SYSTEMS

[75] Inventors: Terry L. Branson, Round Rock; Don Titel, Liberty Hill; Steve Reed, Austin, all of Tex.

[73] Assignee: Tandem Computers Incorporated, Cupertino, Calif.

[21] Appl. No.: 38,519

[22] Filed: Mar. 29, 1993

[51] Int. Cl.⁶ .................................................. B60B 33/04
[52] U.S. Cl. ........................................ 16/19; 16/30; 16/33
[58] Field of Search ............................. 16/18 R, 19, 29, 16/30, 31 R, 32, 33, 24, 35 R, 40

[56] References Cited

U.S. PATENT DOCUMENTS

| | | | |
|---|---|---|---|
| 2,425,675 | 8/1947 | Graff | 16/19 |
| 2,697,243 | 12/1954 | Shager | 16/33 |
| 2,735,130 | 2/1956 | Unsworth | 16/33 |
| 4,748,715 | 6/1988 | Rice | 16/34 |
| 4,918,783 | 4/1990 | Chu | 16/19 |
| 5,193,828 | 3/1993 | Benvenuti | 16/19 |

OTHER PUBLICATIONS

AT&T Wheel Bracket System (as shown in attached photograph), believed to be available on or about 1992.

Primary Examiner—Mark Rosenbaum
Assistant Examiner—Chuck Y. Mah
Attorney, Agent, or Firm—Graham & James

[57] ABSTRACT

A detachable dolly for moving heavy electronic equipment employs a mounting bracket and a wheel assembly, the mounting bracket having a support plate and a mating flange. The mounting bracket is secured to the equipment by the support plate, having at least one lifting dowel, and at least one mounting bolt. The wheel assembly has a wheel mounted within a wheel bracket and a rotation adjustment mechanism for raising and lowering the wheel and is detachably engaged with the mating flange on the mounting bracket by the use of a mating member. The mating member is movably coupled with the adjustment assembly such that when the mating member is engaged with the mating flange, rotation of the adjustment assembly serves to vertically raise or lower the equipment.

18 Claims, 2 Drawing Sheets

5,457,849

COMPACT DETACHABLE DOLLY FOR HEAVY COMPUTER SYSTEMS

BACKGROUND OF THE INVENTION

1. Field of the Invention

The present invention relates to systems for moving heavy equipment. More particularly, the present invention relates to systems for use in moving heavy telecommunications equipment, computers, and other electronics systems.

2. Description of the Prior Art and Related Information

Many businesses and institutions utilize computer systems and other electronic systems incorporating very heavy cabinets enclosing system components. The substantial weight of such systems results from a combination of the hardware components and the cabinet structure itself which must sufficiently protect the system. Shielding, cooling, earthquake reinforcement and other environmental or application factors can significantly increase the weight of the computer systems. When it is necessary to move the equipment, for certain machines and applications it is possible to simply utilize a system that is on wheels. Frequently, however, the size and/or weight of the equipment or applicable governmental agency regulations preclude a free-standing system permanently housed on wheels. Moreover, in certain circumstances, governmental regulations require that the equipment be secured to the floor surface. Because such equipment can not be housed on wheels or rollers, various methods and apparatus must be employed in order to both install the equipment, and to subsequently move the equipment when required.

Where the utilization of a permanent wheel housing is not permitted, the more common methods of moving heavy equipment employ cranes or forklifts. Both cranes and forklifts require large access areas and also involve the purchase or rental of large and expensive moving equipment that may have otherwise very limited use. Additionally, many current installations preclude the use of large moving machinery. Exemplary are the National Equipment Building (NEB) standards which require that in certain environments electrical lines and connections, temperature control apparatus and conduits, and other building wiring or connections be positioned overhead or in ceilings rather than in the facility floor. Where such NEBs are applicable, the use of cranes and similar devices is severely handicapped, or even eliminated, because of potential damage to the overhead connections and equipment.

In such areas where cranes or forklifts cannot be used, due to NEBs or other conditions, a dolly system that is attachable to the equipment has been used. A dolly system has the advantage of being able to lift the equipment up from the floor through the use of comparatively small and compact components. In one prior art dolly system, a number of brackets having wheels are affixed to the equipment to be moved, and the equipment is then raised by rotating the wheel. In such prior art device, however, the weight of the equipment often causes metal fatigue and failure due to the arrangement of the wheel and bracket. Additionally, in the existing device it is difficult to attach the bracket to the body of the equipment to be moved because access to mounting bolts or screws is limited. Still further, the raising of the equipment is often quite difficult due to the arrangement of the components through which vertical adjustment is accomplished.

Accordingly, a need presently exists for a lifting dolly which solves these problems.

SUMMARY OF THE INVENTION

The present invention provides a detachable dolly system for moving heavy electronic equipment such as computer cabinets in environments with limited space. The present invention further provides a dolly system which is easily attached to the electronic equipment when the equipment is moved. The dolly system of the present invention also minimizes metal fatigue and failure caused by the weight of the equipment on the dolly system during the attachment and load lifting and lowering steps of the moving operation.

The dolly system of the present invention employs a detachable wheel bracket system for use with heavy computer systems for initial installation and for moving the systems to new locations as required. The wheel bracket system of the present invention includes a mounting bracket and a separate detachable wheel assembly. After attachment of the mounting bracket to the equipment, the wheel assembly is engaged to the mounting bracket. An adjustment mechanism on the wheel assembly is then used to adjust the wheel bracket system in the vertical direction, and through this vertical adjustment the equipment may be raised off of the floor surface and rolled to the desired location.

In a preferred embodiment, the mounting bracket includes a mating flange and a support plate, which is secured to the equipment by at least one lifting/load bearing dowel and separate mounting bolts. The lifting dowel and mounting bolts are matingly received within the equipment to ensure secure attachment of the mounting bracket. The wheel assembly of the present invention includes a wheel mounted within a wheel bracket and a threaded stem which is secured to the wheel bracket and is integrally attached to a ball bearing assembly. The wheel assembly is detachably engaged with the mounting bracket by a mating member. The mating member is mounted upon and movable along the threaded stem and is receivable within the mating flange. The wheel is raised or lowered along the vertical axis by rotation of the threaded stem, which lifts the equipment through the mating member engaged with the mating flange. Once the equipment is raised off the floor, it may be guided to a new location and then lowered to the ground by rotating the threaded stem in the reverse direction.

It will thus be appreciated that the present invention is easily attached to, and detached from, electronic equipment for facilitating the initial installation and moving of the equipment. The utilization of a detachable wheel assembly in the present invention enables easy access to the mounting bolts and also lessens the stress imposed on the bracket during attachment. Potential fatigue and failure is also lessened by the use of strong lifting dowels and separate mounting bolts.

BRIEF DESCRIPTION OF THE DRAWINGS

The invention will be described with reference to the accompanying drawings, wherein.

DESCRIPTION OF THE PREFERRED EMBODIMENT

The following description is of the best presently contemplated mode of carrying out the invention. This description is made for the purpose of illustrating the general principles of the invention, and is not to be taken in a limiting sense. The scope of the invention is best determined by reference to the appended claims.

Figure 1:
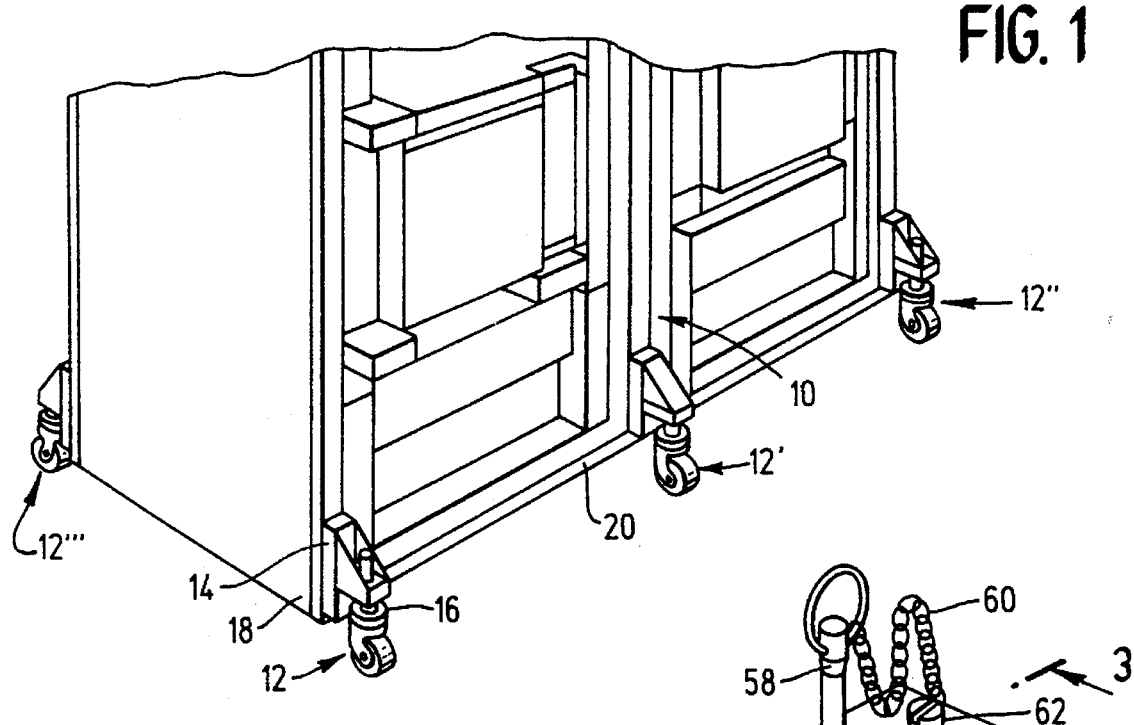
FIG. 1 is a perspective view of a portion of a computer system cabinet incorporating the wheel bracket system of the present invention.

Referring to FIG. 1, a portion of a cabinet housing heavy electronic equipment, e.g., a computer system, is generally shown by reference numeral 10. Although the invention is described with reference to a computer system, the invention may be utilized in other applications where similar size and weight concerns affect the moving of equipment. A wheel bracket system 12 is secured to the cabinet 10 by a mounting bracket portion 14 and a wheel assembly 16 is slidably engagable with the mounting bracket portion 14. As illustrated in FIG. 1, a number of wheel bracket systems (shown as 12, 12', 12", 12"') may be utilized for a single piece of equipment and the wheel bracket systems 12–12"' may be affixed to a corner portion 18 as well as to a side edge 20 of cabinet 10.

Figure 2:
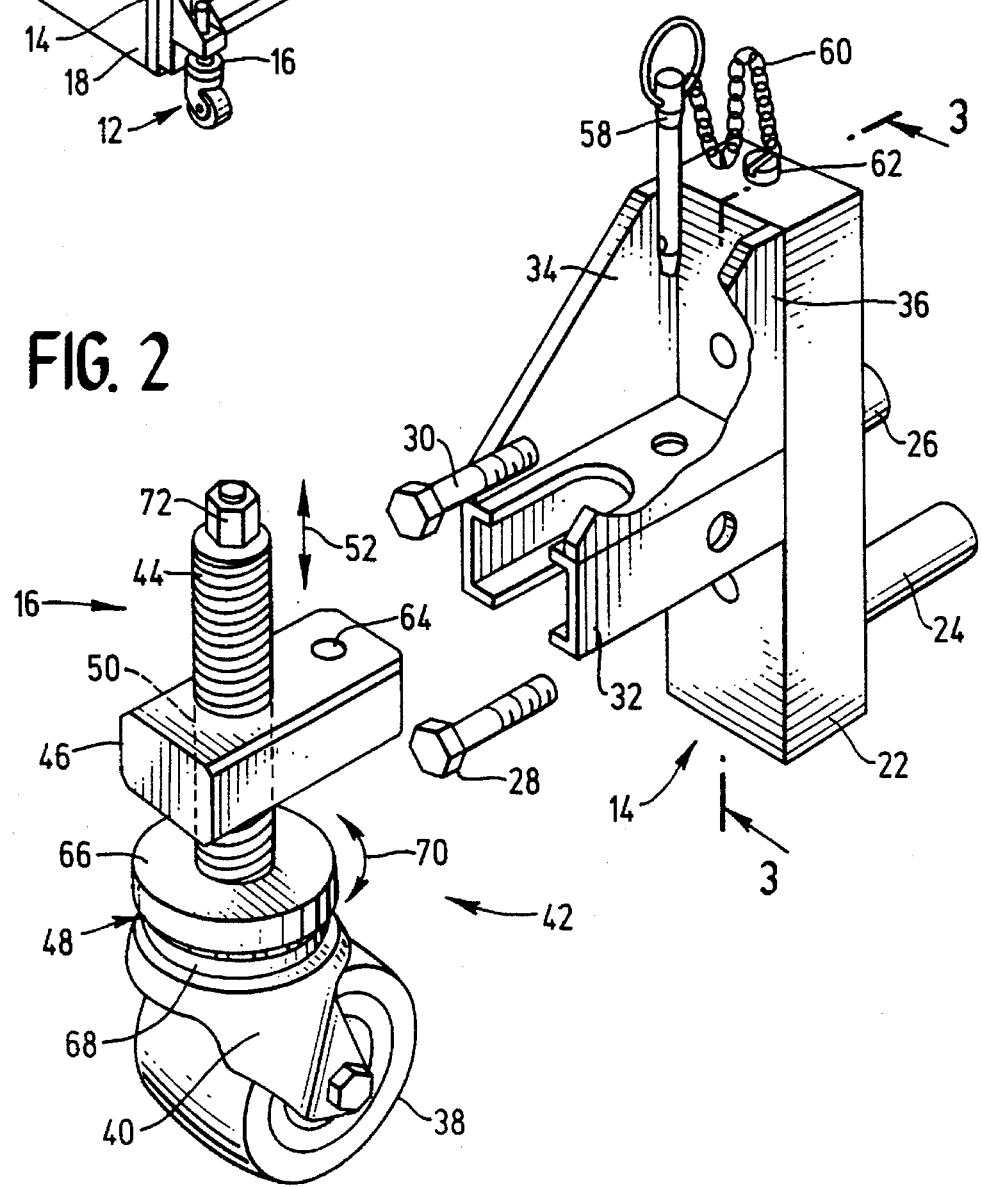
FIG. 2 is an exploded perspective view of the wheel bracket system of the present invention.

FIG. 2 depicts an exploded perspective view of wheel bracket system 12. Mounting bracket 14 includes a plate 22, lifting dowels 24 and 26 (best shown in FIG. 3) and mounting bolts 28 and 30. Mounting bracket 14 also includes a slotted mating flange 32 capable of slidably engaging with wheel assembly 16. As illustrated in FIG. 2, mating flange 32 is disposed perpendicularly to plate 22 and first and second support members 34 and 36 angularly extend therebetween. First and second support members 34 and 36 provide both additional structural support for mounting bracket 14, and also serve to protect portions of wheel assembly 16, as is discussed within.

Wheel assembly 16 includes a wheel 38 engaged with a wheel bracket 40. Wheel bracket 40 is positioned adjacent and integrally attached to an adjustment mechanism 42 which includes a threaded stem 44. It should be appreciated that wheel bracket 40 may take a number of forms (as exemplified by FIGS. 1 and 2), and is limited only in that rotation of wheel 38 and secure attachment with adjustment mechanism 42 must be obtained. Adjustment mechanism 42 provides for the precise adjustment of wheel 38 to allow equipment 10 to be moved. More specifically, adjustment mechanism 42 includes adjustable ball bearing assembly 48 which is affixed to a threaded stem 44. Adjustable ball bearing assembly 48 is rotatably affixed to wheel bracket 40 and rotation of ball bearing assembly 48 serves to rotate threaded stem 44.

A bracket mating member 46 is rotatably attached to threaded stem 44 and is capable of engagably mating with mating flange 32 of mounting bracket 14. The rotatable attachment is achieved by surfaces defining a threaded aperture 50 located on mating member 46 (shown in shadow lines in FIG. 2) and mating member 46 is rotatably moveable in the vertical direction along threaded stem 44. When mating member 46 is slidably engaged with mating flange 32, mating member 46 is fixed along threaded stem 44 such that rotation of threaded stem 44 serves to raise or lower wheel bracket 40 (relative to mating member 46 and mounting bracket 14) along the vertical axis (as shown by directional arrow 52) depending on the direction of rotation.

Figure 3:
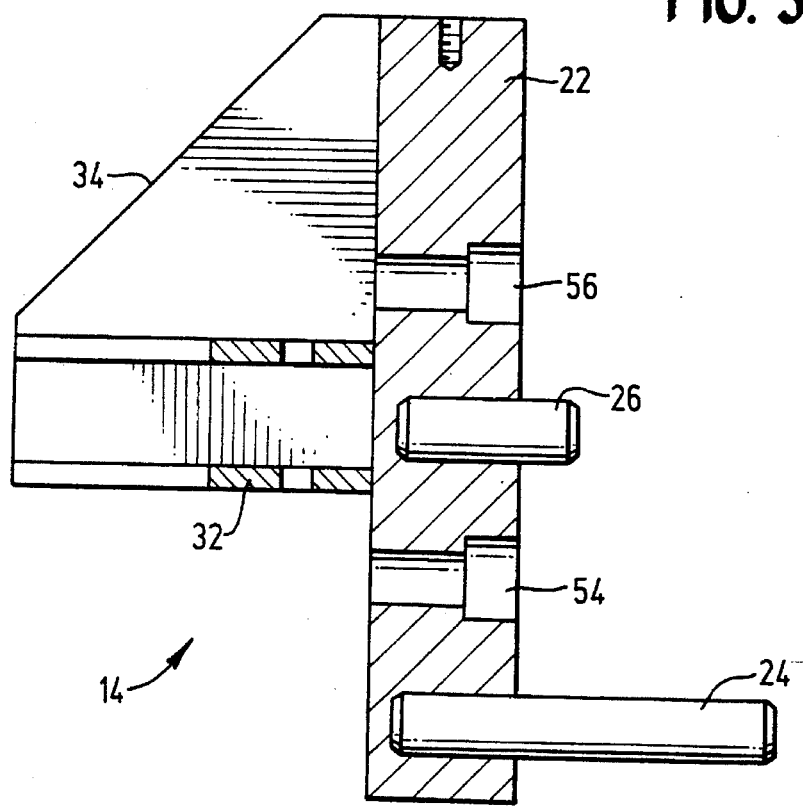
FIG. 3 is a partial cross-sectional view of the wheel bracket system of the present invention taken along plane 3—3 of FIG. 2.

In order to best understand the present invention, the wheel bracket system 12 will be described in more detail with respect to the actual operation and use. FIG. 3, a cross-sectional view of the mounting bracket 14 of the present invention taken along plane 3—3 of FIG. 2, shows support plate 22 and first and second lifting dowels 24 and 26 and apertures for first and second mounting bolts 28 and 30 in greater detail. As illustrated in FIG. 3, first lifting dowel 24 is positioned at the bottom portion of plate 22 and is engagable with a corresponding opening in equipment 10 (not shown) in order to support the equipment load. Second lifting dowel 26 is positioned above first lifting dowel 24 and is also used to lift and support equipment 10 by engaging with a spatially positioned opening in equipment 10 (not shown).

After plate 22 is affixed to equipment 10 by first and second lifting dowels 24 and 26, first and second mounting bolts 28 and 30 (best shown in FIG. 2) are used to securely mount plate 22 to equipment 10. This attachment is obtained as mounting bolts 28 and 30 extend through bolt apertures 54 and 56, respectively. Because wheel assembly 16 may be disengaged from mounting bracket 14, uninterrupted access to mounting bolts 28 and 30 as they are positioned within apertures 54 and 56 is achieved. The utilization of both lifting dowels 24 and 26 and mounting bolts 28 and 30 enables the stresses of mounting/load bearing to which the wheel bracket system 12 is subject to be born predominantly by lifting dowels 24 and 26. Since the dowels are in turn not used for attachment, they may be of simple shape and strong construction. The result is that the likelihood of failure due to stress and fatigue on wheel assembly 16 and on the wheel bracket system 12 as a whole are minimized.

Figure 4:
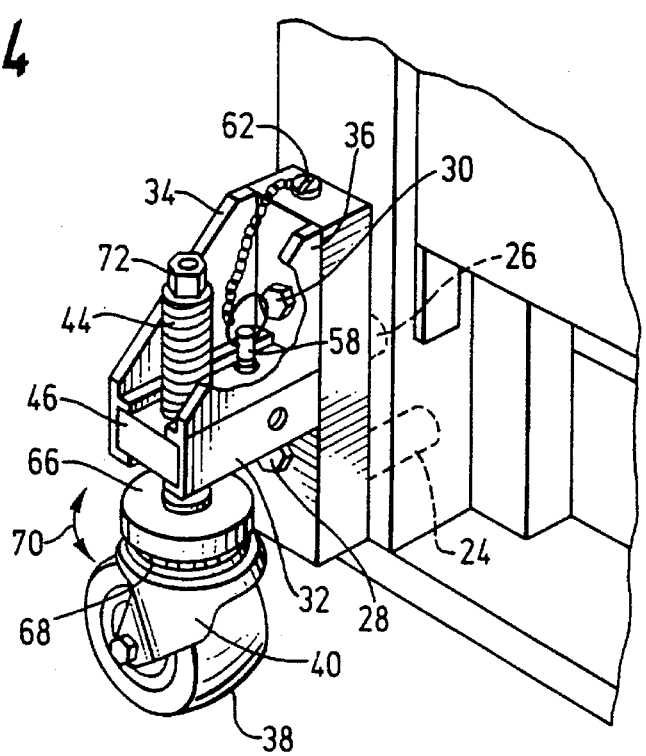
FIG. 4 is a perspective view of the wheel bracket system of the present invention.

Referring finally to FIG. 4, upon securing mounting bracket 14 to equipment 10, wheel assembly 16 may be slidably engaged with mounting bracket 14. This engagement is obtained by slidably fitting mating member 46 within mating flange 32. Mating member 46 may then be locked within mating flange 32 by a locking pin 58 which is attached to mounting bracket 14 by lariat 60 and lariat holder 62. Locking pin 58 is positioned within a proportionally spaced opening 64 on mating member 46 (as best shown in FIG. 2).

Upon secure engagement of mating member 46 with mating flange 32, wheel bracket 40 may be lowered in order to raise equipment 10 above the floor surface. The vertical movement of wheel bracket 40 is controlled by adjustment mechanism 42. Because mating member 46 is locked into place when engaged with mating flange 32 and is also threadingly engaged with threaded stem 44, rotation of threaded stem 44 raises or lowers wheel bracket 40 relative to the position of mating member 46 and bracket portion 14.

The rotation of threaded stem 44 is achieved in two steps. First, initial adjustment of height may be easily controlled by rotation of adjustable ball bearing assembly 48. Ball bearing assembly 48 includes upper casing 66 which is integrally secured to threaded stem 44 and lower casing 68 which is affixed to wheel bracket 40. Ball bearing assembly 48 may be manually rotated by moving upper casing 66, (as shown by directional arrow 70) and this manual rotation serves to rotate threaded stem 44. As upper casing 66 is rotated in a counter-clockwise direction, wheel bracket 40 is lowered by the downward movement of threaded stem 44. Wheel 38 is moved downward and as contact with the floor surface initiated, torque increases due to the weight of equipment 10 and rotation becomes more difficult. Next, threaded stem 44 is further rotated by use of a tool, e.g., a wrench, on bolt 72 affixed to the top portion of threaded stem 44.

The aforementioned rotation functions to raise equipment 10 up from the floor surface, and equipment 10 may then be guided to the desired location. Once appropriately repositioned, wheel 38 may be raised by rotating threaded stem 44 and equipment 10 lowered to the floor surface. Wheel bracket system 12 may then be removed from equipment 10 by reversing the above-described attachment steps. It should be noted that in environments requiring equipment 10 to be secured to the floor surface by a bolting system or other method, it may be possible to use the same apertures on equipment 10 employed to secure the equipment to the floor surface for wheel bracket system 12.

The best presently contemplated mode of carrying out the present invention has been described. A dolly system is provided in which equipment may be raised and moved by a detachable mounting bracket and wheel bracket. While in the preferred embodiment the wheel bracket is slidably engagable with the mounting bracket, it should nevertheless be understood that various modifications may be made without departing from the scope and spirit of the invention which is limited only by the scope of the appended claims.

We claim:

1. A detachable dolly for moving equipment, comprising:
   a mounting assembly including:
   a mounting bracket;
   securing means for securing said mounting bracket to said equipment; and
   support means, attached to the mounting bracket, for supporting the equipment load; and
   a wheel assembly including:
   an adjustable wheel mechanism; and
   engaging means, rotatably coupled to said wheel mechanism, for detachably engaging said wheel assembly to said mounting assembly.

2. The detachable dolly as defined in claim 1, wherein said mounting bracket includes mounting means for releasably receiving said engaging means.

3. The detachable dolly as defined in claim 2, wherein said mounting means is a flange integrally affixed to said mounting bracket and extending perpendicularly therefrom.

4. The detachable dolly as defined in claim 2, wherein said engaging means comprises a mating member having surfaces defining a threaded aperture, and said adjustable wheel mechanism includes a threaded stem, wherein said mating member receives said threaded stem at said aperture, and wherein said mating member is dimensioned to be receivable within said mounting means.

5. The detachable dolly as defined in claim 1, wherein said securing means includes at least one mounting bolt, which is adapted for matingly engaging with said equipment.

6. The detachable dolly as defined in claim 1, wherein said support means includes at least one lift dowel, which is adapted for matingly engaging with said equipment.

7. The detachable dolly as defined in claim 1, wherein said support means includes a first dowel positioned approximately at the middle of said mounting bracket and a second dowel positioned below said first dowel on said mounting bracket.

8. The detachable dolly as defined in claim 1, wherein said adjustable wheel mechanism includes a wheel mounted within a wheel bracket and adjustment means for rotatably raising and lowering said wheel relative to said engaging means.

9. The detachable dolly as defined in claim 8, wherein said adjustment means is a rotatable assembly including a threaded stem and a ball bearing assembly integrally attached thereto, said ball bearing assembly being positioned adjacent said wheel bracket.

10. A detachable dolly for moving equipment, comprising:
    a mounting assembly including:
    a mounting bracket having a support plate and a mounting flange;
    securing means for securing said support plate to said equipment; and
    support means, attached to the mounting bracket, for supporting the equipment load; and
    a wheel assembly including:
    a wheel mounted within a wheel bracket; and
    adjustment means for raising and lowering said wheel along a vertical axis direction, said adjustment means including a threaded stem; and
    a mating member, rotatably coupled to said threaded stem, said mating member detachably engaging said mounting flange on said mounting bracket.

11. The detachable dolly as defined in claim 10, wherein said support means includes at least one lifting dowel which is matingly engagable with said equipment.

12. The detachable dolly as defined in claim 10, wherein said adjustment means includes a ball bearing assembly mounted on said wheel bracket and integrally connected to the threaded stem.

13. A method of moving equipment, comprising the steps of:
    attaching a mounting bracket to said equipment, said mounting bracket including means for receiving a wheel assembly;
    after said attaching step, engaging said wheel assembly to said means for receiving; and
    moving said wheel assembly relative to said mounting bracket along a vertical axis to raise or lower said equipment.

14. A dolly for moving equipment, comprising:
    a mounting bracket including a portion adapted for abutment to the equipment and a connecting member;
    at least one support member, attached to the mounting bracket and adapted for engagement with the equipment to support the weight of the equipment;
    a mating member, detachably engaging the connecting member;
    a wheel bracket;
    a wheel rotatably mounted to the wheel bracket; and
    adjustment means, coupled to the mating member and wheel bracket for raising and lowering the wheel bracket relative to the mounting bracket.

15. The dolly as defined in claim 14, wherein the connecting member includes a flange for receiving the mating member.

16. The dolly as defined in claim 15, wherein the portion adapted for abutment to the equipment includes at least one bolt-receiving aperture.

17. The dolly as defined in claim 16, wherein the support member is a dowel disposed in a perpendicular relationship to the bracket portion adapted for abutment to the equipment.

18. The dolly as defined in claim 14, wherein the adjustment means includes a screw for rotatably raising and lowering the wheel bracket relative to the mounting bracket and the mating member includes a threaded aperture receiving the screw.

* * * * *